(12) United States Patent
Kuriyama

(10) Patent No.: US 7,847,852 B2
(45) Date of Patent: Dec. 7, 2010

(54) SOLID-STATE IMAGING DEVICE AND MANUFACTURING METHOD OF SOLID-STATE IMAGING DEVICE

(75) Inventor: Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 1330 days.

(21) Appl. No.: 11/196,740

(22) Filed: Aug. 4, 2005

(65) Prior Publication Data

US 2006/0027825 A1    Feb. 9, 2006

(30) Foreign Application Priority Data

Aug. 6, 2004   (JP)   .............................. 2004-231318

(51) Int. Cl.
  *G02B 13/16*   (2006.01)
  *H04N 5/225*   (2006.01)
(52) U.S. Cl. ........................ 348/335; 348/340; 348/345; 348/348
(58) Field of Classification Search ................. 348/335, 348/340, 345, 348; 250/201.1, 201.2; 257/294; 359/620, 621, 628, 629, 639
See application file for complete search history.

(56) References Cited

U.S. PATENT DOCUMENTS

| | | | |
|---|---|---|---|
| 5,610,390 A * | 3/1997 | Miyano | ....................... 250/216 |
| 5,623,143 A | 4/1997 | Takamatsu | |
| 7,453,130 B2 * | 11/2008 | Nakai | .......................... 257/432 |
| 2001/0039061 A1 | 11/2001 | Suzuki et al. | |

FOREIGN PATENT DOCUMENTS

| | | | |
|---|---|---|---|
| CN | 1126375 | | 7/1996 |
| JP | 63-147365 | | 6/1988 |
| JP | 63147365 A | * | 6/1988 |
| JP | 4-75382 | | 3/1992 |
| JP | 6-132502 | | 5/1994 |
| JP | 8-116041 | | 5/1996 |
| JP | 10-229180 | | 8/1998 |
| JP | 11-340446 | | 12/1999 |
| JP | 2001-160973 | | 6/2001 |
| JP | 2002-530895 | | 9/2002 |
| JP | 2002-365784 | | 12/2002 |
| JP | 2004-347693 | | 12/2004 |
| WO | 00/31804 | | 6/2000 |

* cited by examiner

*Primary Examiner*—Yogesh K Aggarwal
(74) *Attorney, Agent, or Firm*—Wenderoth, Lind & Ponack, L.L.P.

(57) ABSTRACT

An object of the present invention is to provide a solid-state imaging device that can be slimmed down and have an improved picture quality without sacrificing its sensitivity and the manufacturing method of the solid-state imaging device. The solid-state imaging device includes an imaging unit where unit cells are arranged in a two-dimensional array. Each of these unit cells has a photodiode and a first microlens and a second microlens which are formed above the photodiode. The maximum curvatures of the convex parts become greater from the center part to the periphery of the imaging unit.

10 Claims, 12 Drawing Sheets

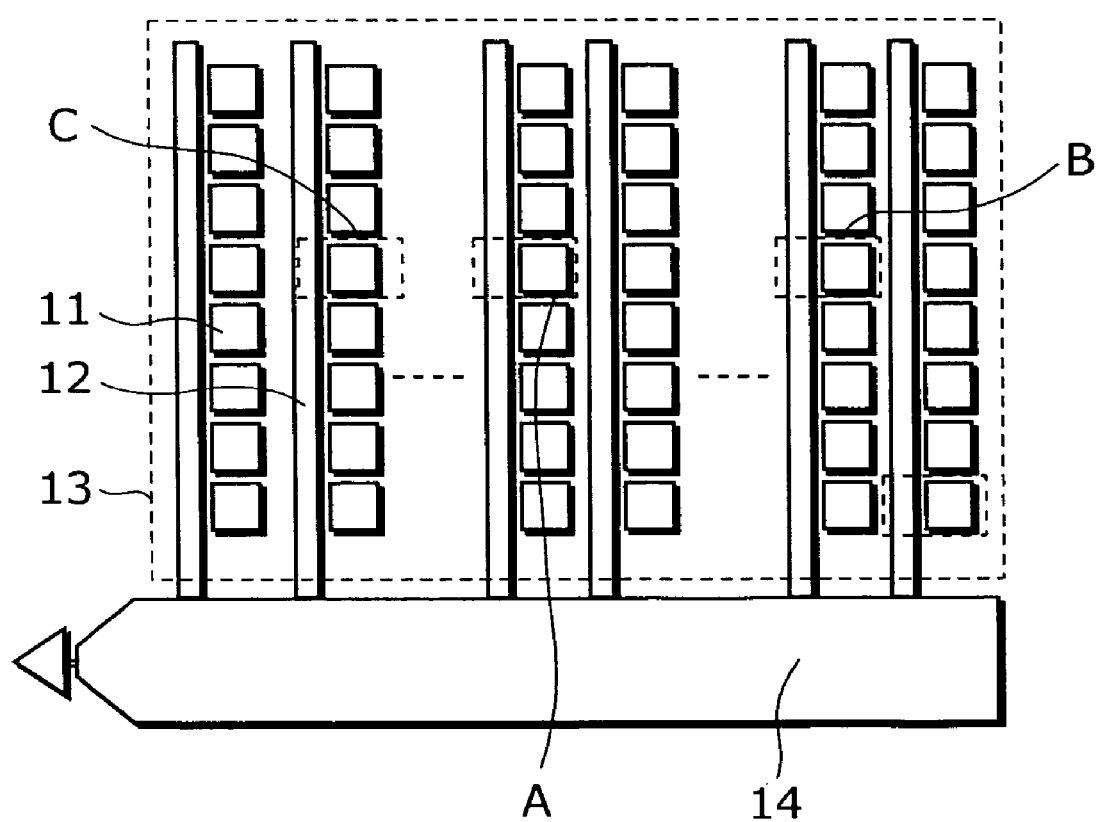

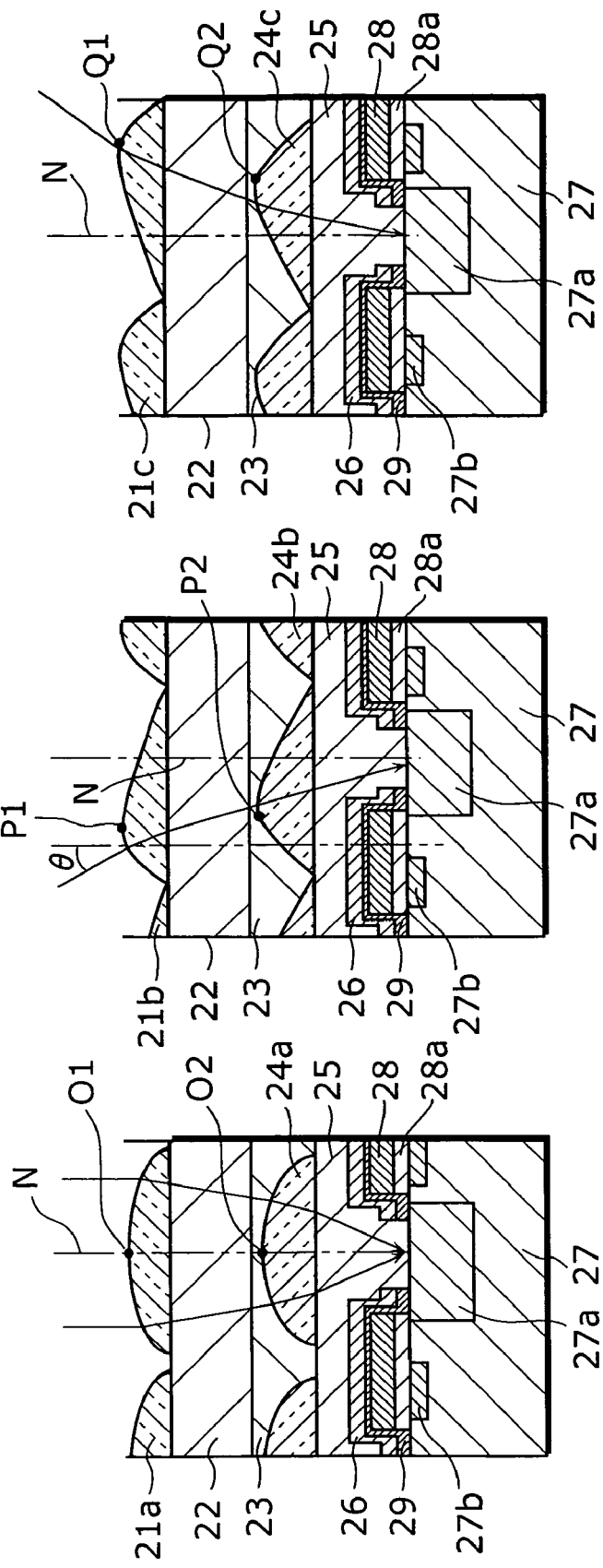

US 7,847,852 B2

SOLID-STATE IMAGING DEVICE AND MANUFACTURING METHOD OF SOLID-STATE IMAGING DEVICE

BACKGROUND OF THE INVENTION (1) Field of the Invention

The present invention relates to a solid-state imaging device, especially to a microlens that is placed above a photoelectric conversion element.

(2) Description of the Related Art

With the widespread proliferation of digital video cameras (DVDs), digital still cameras (DSCs) and mobile phones having an internal camera, the market of solid-state imaging devices has been widespread. In this movement, there is a strong demand to improve sensitivity of a solid-state imaging device.

At present, a CCD type or a MOS type solid-state imaging device includes an image capturing unit where unit cells are arranged in a two-dimensional array, each of which having a photoelectric conversion element and converting a light signal obtained from a subject into an electrical signal. In a solid-state imaging device like this, its sensitivity is defined by the magnitude of output currents of photoelectric conversion elements, the output currents corresponding to the amount of incident light. Therefore, making sure incident light reaches photoelectric conversion elements is an important factor for improving its sensitivity. Thus, in general, light condensing efficiency to each photoelectric conversion element is improved by placing a microlens above each photoelectric conversion element.

It is noted that the light condensing efficiency of each microlens deteriorates depending on the angle of light incidence. In other words, an incident light perpendicular to each photoelectric conversion element can be efficiently condensed to the photoelectric conversion element, but an incident light oblique to each photoelectric conversion element cannot be efficiently condensed to the photoelectric conversion element. Therefore, in the case of a wide angle incident light, a problem exists in that the light condensing efficiency to each photoelectric conversion element in the peripheral part deteriorates because the angle of incident light in the peripheral part of the image capturing unit is different from the angle of incident light in the center part.

The prior art that solves this problem includes a CCD type solid-state imaging device disclosed in Japanese Laid-Open Patent Application No. 10-229180publication. FIG. 1 is a top view showing the outline of the CCD type solid-state imaging device disclosed in Japanese Laid-Open Patent Application No. 10-229180 publication. FIG. 2A is a cross-sectional view showing the outline of a unit cell 31 and its peripheral part (shown as H in FIG. 1). FIG. 2B is a cross-sectional view showing the outline of a unit cell 31 and its peripheral part (shown as I in FIG. 1). FIG. 2C is a cross-sectional view showing the outline of a unit cell 31 and its peripheral part (shown as J in FIG. 1).

As shown in FIG. 1, a conventional CCD type solid-state imaging device is composed of unit cells 31, perpendicular CCDs 32 and a horizontal CCD 34. These unit cells are arranged in a two-dimensional array, each of which has: a photodiode as a photoelectric conversion element; and a first microlens and a second microlens each of which has a convex part. These perpendicular CCDs 32 are placed correspondingly for each column of unit cells 31, and transfers a signal charge that is read out from each unit cell 31 to the column direction. Also, a horizontal CCD 34 is placed next to the image capturing unit 33 where unit cells 31 and perpendicular CCDs 32 are placed, reads out a signal charge from each perpendicular CCD 32, and transfers each read-out signal charge to the line direction.

As shown in FIG. 2A, in the center part of the image capturing unit 33 of the CCD type solid-state imaging device having the above-described structure, the incident light to the image capturing unit 33 is condensed by each first microlens 41, is subjected to color separation by means of a color filter 42, passes through the planarization film 43, and then is further condensed by each second microlens 44 as an intra layer lens. The light condensed by the second microlens 44 passes through a planarization film 45 and enters an opening of a light shielding metal film 46, and then enters each photodiode 47a that is formed in the Si substrate 47 as a semiconductor substrate. The light that enters the photodiode 47 is converted into signal charges, and then the generated signal charges are transferred to electric charge transferring parts 47b respectively. Each electric charge transferring part 47b transfers a signal charge when voltage is applied to each gate electrode 48 formed on a gate insulating film 48a covered with an insulation film 49. Here, the incidence direction of the light that enters the first microlens 41 is the direction perpendicular to the light incidence surface of the photodiode 47a, and the first microlens 41 and the second microlens 44 each has a shape that guides the light in the perpendicular direction to the photodiode 47a. Therefore, the light that enters the first microlens 41 heads to the photodiode 47a instead of heading to the light shielding metal film 46.

Likewise, as shown in FIG. 2B, in the right peripheral part of the image capturing unit 33, the incident light to the image capturing unit 33 is condensed by the first microlens 41 and the second microlens 44 enters the photodiode 47a, and then is converted into a signal charge. After that, the resulting signal charge is transferred by the electric charge transferring part 47b. Here, the incidence direction of the light that enters the first microlens 41 is the direction oblique to the light incidence surface of the photodiode 47a, and the first microlens 41 and the second microlens 44 each has the same shape as the microlens in the center part. However, the center axis L1 of the second microlens 44 is displaced to the left from the center axis K of the opening, in other words, is displaced closer to the center part of the image capturing unit 33, and the center axis L2 of the first microlens 41 is displaced to the left becoming more distant from the center axis K of the opening than the center axis L1 of the second microlens 44 is. Therefore, the light that enters the first microlens 41 heads to the photodiode 47a.

Likewise, as shown in FIG. 2C, in the left peripheral part of the image capturing unit 33, the incident light to the image capturing unit 33 is condensed by the first microlens 41 and the second microlens 44, enters the photodiode 47a, and then is converted into a signal charge. After that the resulting signal charge is transferred by the electric charge transferring part 47b. Here, the direction of the incident light to the first microlens 41 is the direction oblique to the light incidence surface of the photodiode 47a, and the first microlens 41 and the second microlens 44 each has the same shape as the microlens in the center part. However, the center axis M1 of the second microlens 44 is displaced to the right from the center axis K of the opening, in other words, is displaced closer to the center part of the image capturing unit 33, and the center axis M2 of the first microlens 41 is displaced to the right becoming more distant from the center axis K of the opening than the center axis M1 of the second microlens 44 is. Therefore, the light that enters the first microlens 41 heads to the photodiode 47a.

As described above, in the CCD type solid-state imaging device disclosed in Japanese Laid-Open Patent Application No. 10-229180 publication, in the peripheral part of the image capturing unit, the center axis of a microlens is displaced closer to the center part of the image capturing unit from the center axis of the opening. This prevents deterioration in light condensing efficiency to each photodiode in the peripheral part, and thus it becomes possible to realize the CCD type solid-state imaging device having a high sensitivity.

SUMMARY OF THE INVENTION

However, the CCD type solid-state imaging device disclosed in Japanese Laid-Open Patent Application No. 10-229180 publication has a problem that it cannot be slimed down because of the following reasons. Since an angle of light incidence to the peripheral part of the image capturing unit becomes greater when a solid-state imaging device is slimed down, such an incident light must be condensed by widely displacing microlenses in the peripheral part of the image capturing unit from their normal positions. However, since the allowable distance ranges of displacement of such microlenses are restricted depending on the distances between adjacent microlenses, it is impossible to slim down such a solid-state imaging device without sacrificing its sensitivity. At this time, since the size of each unit cell becomes smaller accompanied by increase in the number of pixels of the solid-state imaging device, it becomes difficult to maintain a high light condensing efficiency to photodiodes when trying to increase the number of pixels of the solid-state imaging device on the purpose of improving the picture quality. Therefore, when trying to increase the number of pixels of the solid-state imaging device and slim down the device concurrently, this problem becomes especially troublesome.

Therefore, the present invention is conceived considering the problem. An object of the present invention is to provide a slim solid-state imaging device that is capable of improving picture quality without sacrificing its sensitivity and the manufacturing method of the solid-state imaging device.

In order to achieve the above-described object, the solid-state imaging device, of the present invention, includes an image capturing unit where unit cells are arranged in a two-dimensional array, each unit cell including a photoelectric conversion element and a convex microlens that is formed above the photoelectric conversion element, and in the invention, the maximum curvatures of the convex microlenses which are respectively included in the unit cells in the peripheral part of the image capturing unit are greater than the maximum curvatures of the convex microlenses which are respectively included in the center part of the image capturing unit. Also, in a first aspect of the present invention, the maximum curvatures of the convex microlenses which are respectively included in the unit cells may become greater from the center part to the periphery of the image capturing unit. Here, in a second aspect of the present invention, in the solid-state imaging device, a microlens which is included in each unit cell in the center part of the image capturing unit may have a cross-sectional shape that is line symmetric with respect to a line which is perpendicular to the light incidence surface of a photoelectric conversion element and passes through the summit of the convex microlens, and a microlens which is included in each unit cell in the peripheral part of the image capturing unit may have a cross-sectional shape that is line asymmetric with respect to a line which is perpendicular to the light incidence surface of a photoelectric conversion element and passes through the summit of the convex microlens. In the first aspect of the present invention, in the solid-state image capturing device, a microlens which is included in each unit cell in the peripheral part of the image capturing unit may have the same base shape as a microlens which is included in each unit cell in the center part of the image capturing unit, and the height of the microlens which is included in each unit cell in the peripheral part of the image capturing unit may be greater than the height of the microlens which is included in each unit cell in the center part of the image capturing unit, the height being measured from the base of the microlens.

In this way, displacement, from the axes of the openings, of the convex part summits of the microlenses become gradually greater towards the center direction or the ongoing direction as the positions of these microlenses change from the center part to the peripheral part. Also, the heights of the microlenses become slightly greater from the central part towards the peripheral part. This prevents deterioration in light condensing efficiency to the photoelectric conversion elements in the peripheral part. Thus a slim solid-state imaging device having an improved picture quality can be realized without sacrificing its sensitivity.

Also, in a third aspect of the present invention, the solid-state imaging device may further include a lens structure which is formed by laminating microlens layers, and in the invention, the maximum curvatures of the convex microlenses which are respectively included in the unit cells in the peripheral part of the image capturing unit may be greater than the maximum curvatures of the convex microlenses which are respectively included in the center part of the image capturing unit in at least two microlens layers In this way, it becomes possible to improve the light condensing efficiency of the solid-state imaging device. Thus it becomes possible to realize a solid-state imaging device having a further improved sensitivity.

Also, the present invention may also be realized as a gray scale mask that is used in forming a microlens of a solid-state imaging device, and in the gray scale mask, unit patterns are formed two-dimensionally in the gray scale mask, unit patterns in the center part of the gray scale mask have a line symmetric transmittance distribution, and unit patterns in the peripheral part of the gray scale mask have a line asymmetric transmittance distribution.

Also, the present invention may also be realized as a manufacturing method of a solid-state imaging device that has a feature of having a forming step of microlenses using the gray scale mask.

In this way, it becomes possible to easily form microlenses having a convex part so that the maximum curvatures of these convexes become greater to the periphery of the image capturing unit. Thus it becomes possible to manufacture a slim solid-state imaging device having an improved picture quality at low cost without sacrificing its sensitivity.

With the present invention, it becomes possible to provide a slim solid-state imaging device having an improved sensitivity and also having an improved picture quality and a manufacturing method of the solid-state imaging device.

In this way, data can be outputted by a slim solid-state imaging device having an improved sensitivity and also an improved picture quality. Thus it becomes possible to realize a compact camera having an excellent picture quality.

Since the present invention can realize a compact camera having an excellent picture quality, and thus the present invention is highly industrially practical.

The disclosure of Japanese Patent Application No. 2004-231318 filed on Aug. 6, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a top view showing the outline of a CCD type solid-state imaging device in a first embodiment of the present invention;

FIG. 4A is a cross-sectional view of the outline of a unit cell and its peripheral area (A in FIG. 3);

FIG. 4B is a cross-sectional view of the outline of a unit cell and its peripheral area (B in FIG. 3);

FIG. 4C is a cross-sectional view of the outline of a unit cell and its peripheral area (C in FIG. 3);

DESCRIPTION OF THE INVENTION

A solid-state imaging device in embodiments of the present invention will be described below with reference to figures.

FIG. 3 is a top view showing the outline of a CCD type solid-state imaging device of this embodiment. Also, FIG. 4A is a cross-sectional view of the outline of a unit cell 11 and its peripheral area (A in FIG. 3). FIG. 4B is a cross-sectional view of the outline of a unit cell 11 and its peripheral area (B in FIG. 3). FIG. 4C is a cross-sectional view of the outline of a unit cell 11 and its peripheral area (C in FIG. 3).

As shown in FIG. 3, the CCD solid-state imaging device in this embodiment is composed of unit cells 11, perpendicular CCDs 12 and a horizontal CCD 14. These unit cells 11 are arranged in a two-dimensional array and each of which has: a photodiode as a photoelectric conversion element; and a first microlens and a second microlens each of which has a convex part. These perpendicular CCDs 12 are placed correspondingly for each column of unit cells 11, and transfers a signal charge that is read out from each unit cell 11 to the column direction. Also, a horizontal CCD 14 is placed next to the image capturing unit 13 where unit cells 11 and perpendicular CCDs 12 are placed, reads out a signal charge from each perpendicular CCD 12, and transfers each read-out signal charge to the line direction.

Figure 1:
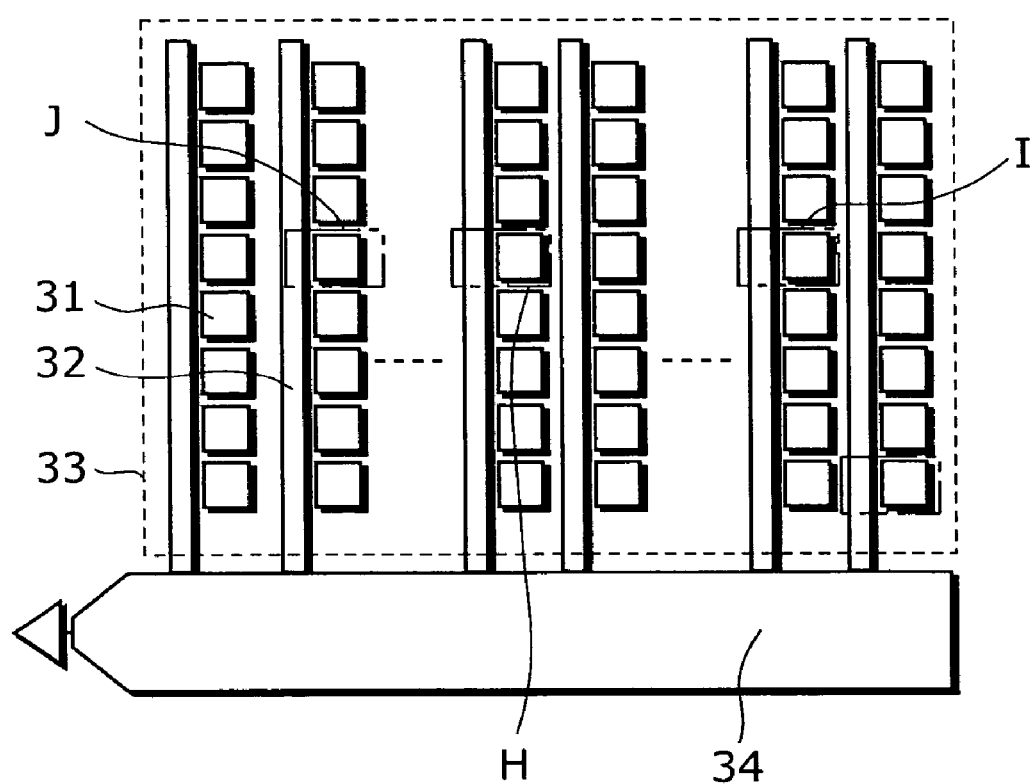
FIG. 1 is a top view showing the outline of a CCD type solid-state imaging device disclosed in Japanese Laid-Open Patent Application No. 10-229180 publication.
Figure 2A:
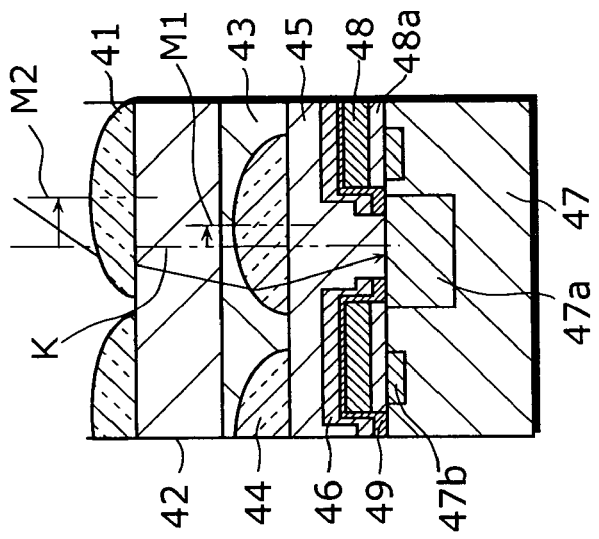
FIG. 2A is a cross-sectional view showing the outline of a unit cell and its peripheral area (H in FIG. 1)
Figure 2B:
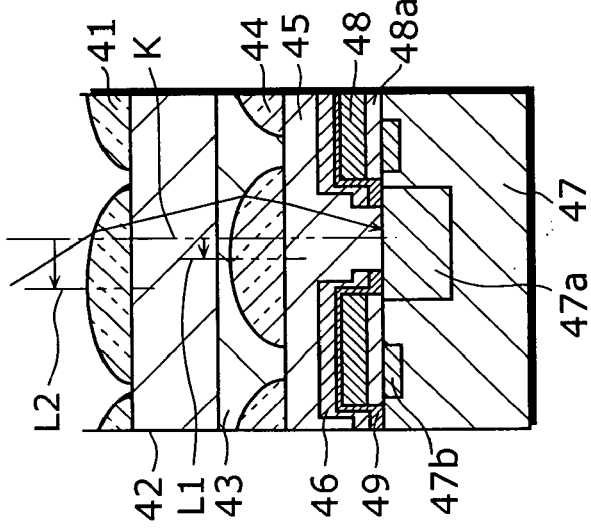
FIG. 2B is a cross-sectional view showing the outline of a unit cell and its peripheral area (I in FIG. 1)
Figure 2C:
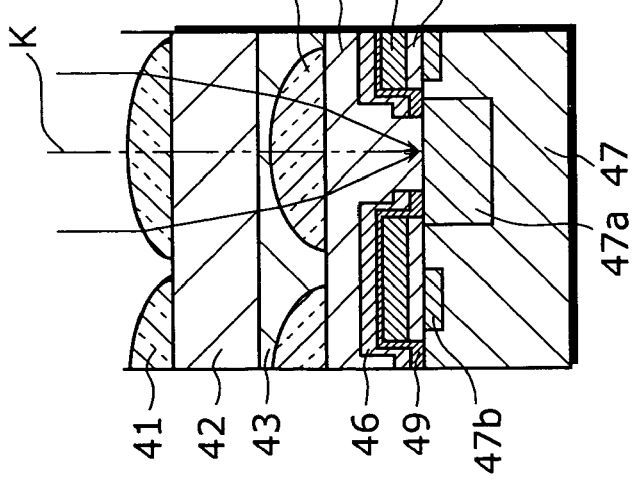
FIG. 2C is a cross-sectional view showing the outline of a unit cell and its peripheral area (J in FIG. 1)
Figure 5A:
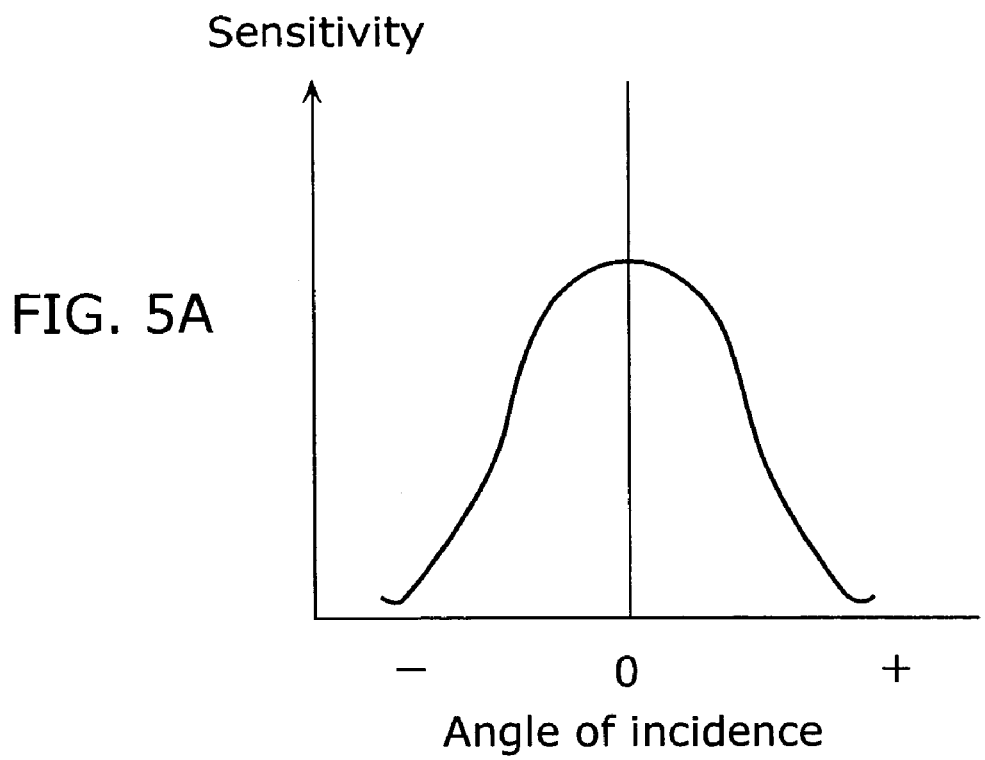
FIG. 5A is a diagram showing dependency on an angle of light incidence of sensitivity in the center part of the image capturing unit.

As shown in FIG. 4A, in the center part of the image capturing unit 13 of the CCD type solid-state imaging device having the above-described structure, the incident light to the image capturing unit 13 is condensed by the first microlens 21a, is subjected to color separation by means of a color filter 22, passes through the planarization film 23, and then is further condensed by the second microlens 24a as an intra layer lens. The light condensed by the second microlens 24a passes through a planarization film 25 and enters an opening of a light shielding metal film 26, and then enters a photodiode 27a that is formed in the Si substrate 27 as a semiconductor substrate. The light that enters the photodiodes 27a is converted into signal charges, and then the generated signal charges are transferred to the electric charge transferring parts 27b respectively. Each electric charge transferring part 27b transfers a signal charge when voltage is applied to a gate electrode 28 formed on a gate insulating film 28a covered with an insulation film 29. Here, the convex summits O1 and O2, which are the highest points from the corresponding bases of the first microlens 21a and the second microlens 24a, are positioned along the axis which passes through the mid point on the light incidence surface of the photodiode 27a and along the axis of the opening that is perpendicular to the light incidence surface. The incidence direction of the light that enters the first microlens 21a is the direction perpendicular to the light incidence surface of the photodiode 27a. Therefore, the light that enters the first microlens 21a heads to the photodiode 27a instead of heading to the light shielding metal film 26. At this time, as shown in FIG. 5A, the sensitivity in the center part of the image capturing unit changes depending on the angle of light incidence θ to the light incidence surface. In other words, the sensitivity is at a maximum when the angle of light incidence θ is 0 degree.

Figure 5B:
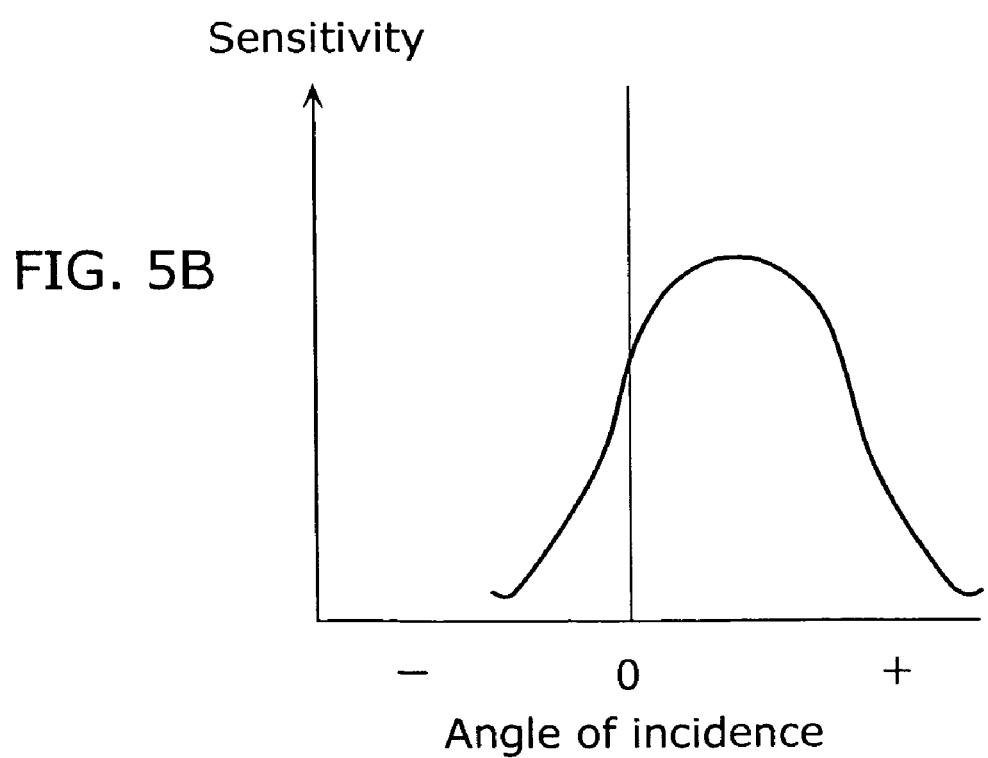
FIG. 5B is a diagram showing dependency on an angle of light incidence of sensitivity in the peripheral part of the image capturing unit.

Likewise, as shown in FIG. 4B, in the right peripheral part of the image capturing unit 13, the light that enters the image capturing unit 13 is condensed by the first microlens 21b and the second microlens 24b, enters the photodiode 27a, and is converted into signal charges. After that, the resulting signal charges are transferred by the electric charge transferring part 27b. Here, the incidence direction of the light that enters the first microlens 21b is the direction oblique to the light incidence surface of the photodiode 27a. However, the first microlens 21b and the second microlens 24b have the following features: each of which has a shape that is different from the shapes of the first microlens 21a and the second microlens 24a in the center part; the maximum curvatures of the first microlens 21b and the second microlens 24b are greater than the maximum curvatures of the first microlens 21a and the second microlens 24a in the center part; and the summits P1 and P2 of these convex microlenses 21b and 24b are displaced to the left, in other words, to the center part of the image capturing unit 33 from the axis N of the opening. Therefore, the light that enters the first microlens 21b heads to the photodiode 27a. At this time, as shown in FIG. 5B, the sensitivity in the peripheral part of the image capturing unit changes depending on the angle of light incidence θ to the light incidence surface. In other words, the sensitivity does not become the maximum value when the angle of light incidence θ is 0 degree.

Likewise, as shown in FIG. 4C, in the left peripheral part of the image capturing unit 13, the light that enters the image capturing unit 13 is condensed by the first microlens 21c and the second microlens 24c, enters the photodiode 27a, and is converted into signal charges. After that, the resulting signal charges are transferred by the electric charge transferring parts 27b. Here, the incidence direction of the light that enters the first microlens 21c is the direction oblique to the light incidence surface of the photodiode 27a. However, the first microlens 21c and the second microlens 24c have the following features: each of which has a shape that is different from the shapes of the first microlens 21a and the second microlens 24a in the center part; the maximum curvatures of the first microlens 21c and the second microlens 24c are greater than the maximum curvatures of the first microlens 21a and the second microlens 24a in the center part; and the summits Q1 and Q2 of these convex microlenses 21c and 24c are displaced to the right, in other words, to the center part of the image capturing unit 33 from the axis N of the opening. Therefore, the light that enters the first microlens 21c heads to the photodiode 27a. At this time, the sensitivity in the peripheral part of the image capturing unit does not become the maximum value when the angle of light incidence θ is 0 degree.

Figure 6:
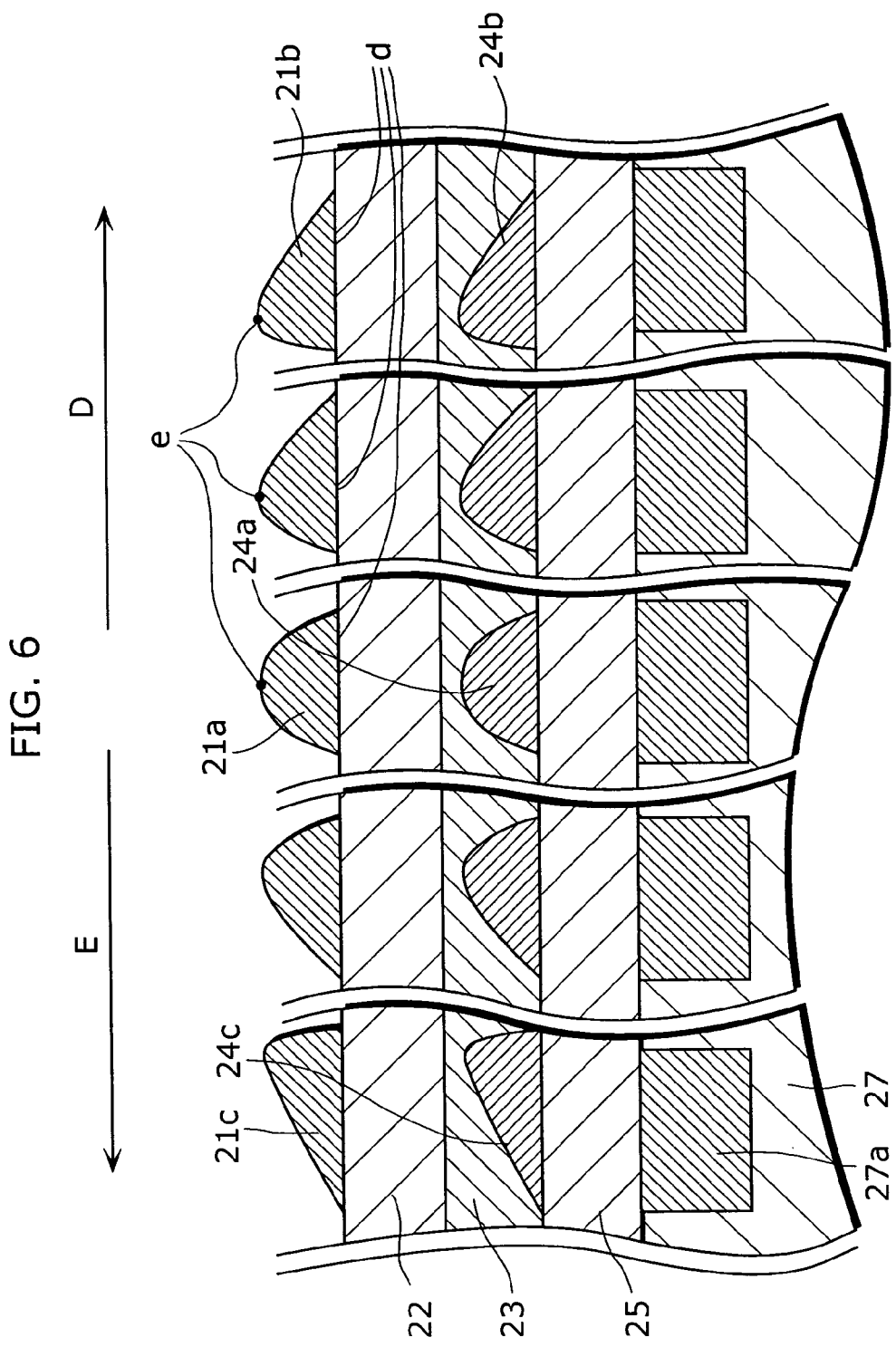
FIG. 6 is a cross-sectional view of the outline of the CCD solid-state imaging device, and the view is for showing the change in the shapes of microlenses.
Figure 7B:
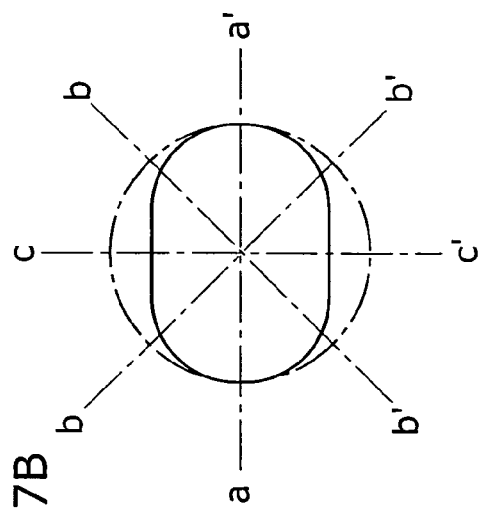
FIG. 7B is a top view for showing a microlens having a line symmetric cross-sectional shape.
Figure 7D:
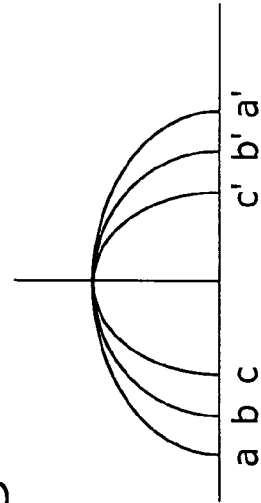
FIG. 7D is a cross-sectional view of a microlens having a line symmetric cross-sectional shape.
Figure 7A:
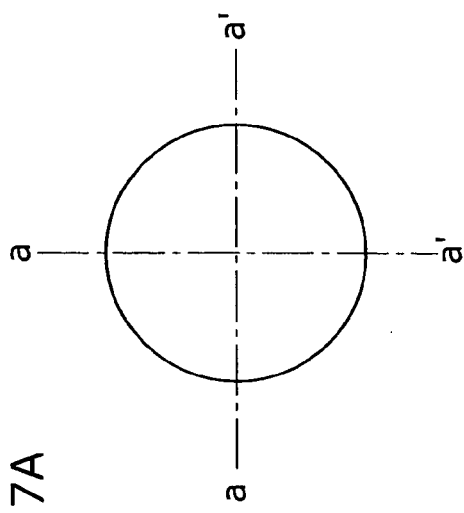
FIG. 7A is a top view for showing a microlens having a line symmetric cross-sectional shape.
Figure 7C:
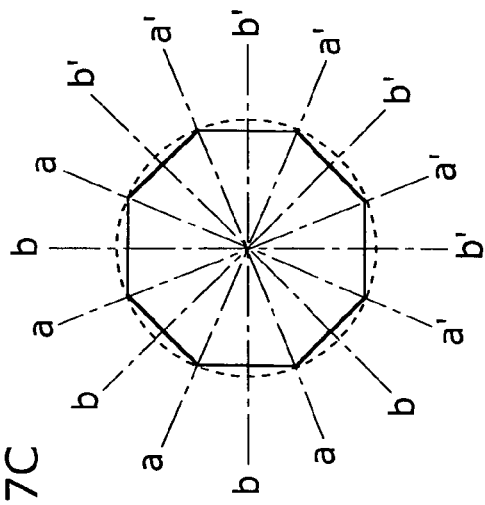
FIG. 7C is a top view for showing a microlens having a line symmetric cross-sectional shape.

Here, as shown in a cross-sectional view showing the outline of the CCD type solid-state imaging device of FIG. 6, the maximum curvatures of these microlenses increase to the outer periphery. Also, the displacement, from the axes of these openings, of the summits of the first microlenses and the second microlenses become greater to the outer periphery. In other words, the displacement, from the axes of these openings, of the summits of the first microlenses and the second microlenses become greater from the center part to the right peripheral part of the image capturing unit 13 (to D direction of FIG. 6). The shapes of microlenses change from line symmetric cross-sectional shapes of microlenses such as the first microlens 21a and the second microlens 24a to line asymmetric cross-sectional shapes of microlenses such as the first microlens 21b and the second microlens 24b as the positions of the microlenses change from the center part to the peripheral part. Likewise, the displacement, from the axes of these openings, of the summits of the first microlenses and the second microlenses become greater from the center part to the left peripheral part of the image capturing unit 13 (to E direction of FIG. 6). The shapes of microlenses change from line symmetric cross-sectional shapes of microlenses such as the first microlens 21a and the second microlens 24a to line asymmetric cross-sectional shapes of microlenses such as the first microlens 21c and the second microlens 24c as the positions of the microlenses change from the center part to the peripheral part. At this time, a cross-sectional shape of a convex microlens is the cross-sectional shape that is perpendicular to the light incidence surface of the photodiode 27a and passes through the summit e of the microlens, the summit being the highest position of the microlens when measured from the base surface d Note that, a hemisphere-shaped microlens is an example of line symmetric shapes shown in FIGS. 7A and FIG. 7D. FIG. 7A is a top view of the microlens represented as a complete round. FIG. 7D is a cross-sectional view (cross-section shown by the a-a' line of FIG. 7A) of the microlens represented as a half round that is symmetric with respect to the axis being the line that passes through the mid point of the a-a' line and that is perpendicular to the a-a' line. Another example of a microlens that has a line symmetric hemisphere shape is shown in FIG. 7B and FIG. 7D. FIG. 7B is a top view of the microlens represented as an ellipse. FIG. 7D is a cross-sectional view (cross-section shown by the a-a' line, the b-b' line and the c-c' line of FIG. 7B) of the microlens represented as a half round that is symmetric with respect to the axis being the line that passes through the mid point of the a-a', b-b' and c-c' lines and that is perpendicular to these lines. Still another example of a microlens that has a line symmetric hemisphere shape is shown in FIG. 7C and FIG. 7D. FIG. 7C is a top view of the microlens represented as an octagon. FIG. 7D is a cross-sectional view (cross-section shown by the a-a' line and the b-b' line of FIG. 7C) of the microlens represented as a half round that is symmetric with respect to the axis being the line that passes through the mid point of the a-a' and b-b' lines and that is perpendicular to these lines.

Figure 8A:
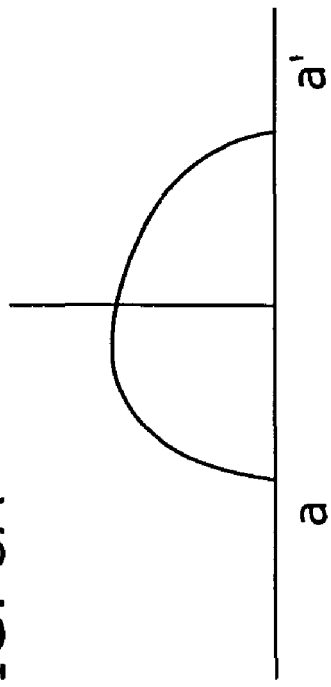
FIG. 8A is a cross-sectional view of a microlens having a line asymmetric cross-sectional shape.
Figure 8B:
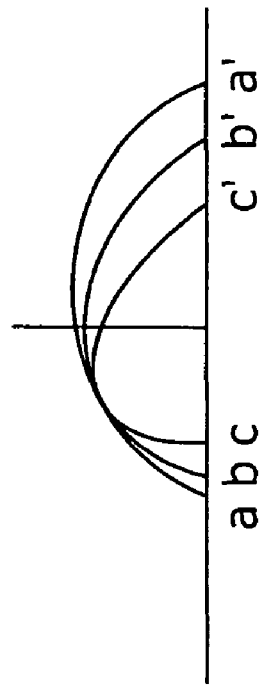
FIG. 8B is a cross-sectional view of a microlens having a line asymmetric cross-sectional shape.

On the other hand, an example of a microlens that has a line asymmetric hemisphere is shown in FIG. 7A and FIG. 8A. FIG. 7A is a top view of the microlens represented as a complete round. FIG. 8A is a cross-sectional view (cross-section shown by the a-a' line of FIG. 7A) of the microlens represented as a half round that is asymmetric with respect to the axis being the line that passes through the mid point of the a-a' line and that is perpendicular to the a-a' line. Another example of a microlens that has a line asymmetric hemisphere is shown in FIG. 7B and FIG. 8B. FIG. 7B is a top view of the microlens represented as an ellipse. FIG. 8B is a cross-sectional view (cross-section shown by the a-a' line, the b-b' line and the c-c' line of FIG. 7B) of the microlens represented as a half round that is asymmetric with respect to the axis being the line that passes through the mid point of the a-a', b-b' and c-c' lines and that is perpendicular to these lines. Still another example of a microlens that has a line asymmetric cross-sectional shape is shown in FIG. 7C and FIG. 8B. FIG. 7C is a top view of the microlens represented as an octagon. FIG. 8B is a cross-sectional view (cross-section shown by the a-a' line and the b-b' line of FIG. 7C) of the microlens represented as a half round that is asymmetric with respect to the axis being the line that passes through the mid point of the a-a' and b-b' lines and that is perpendicular to these lines.

Next, a forming method of a microlens will be described below.

Figure 9A:
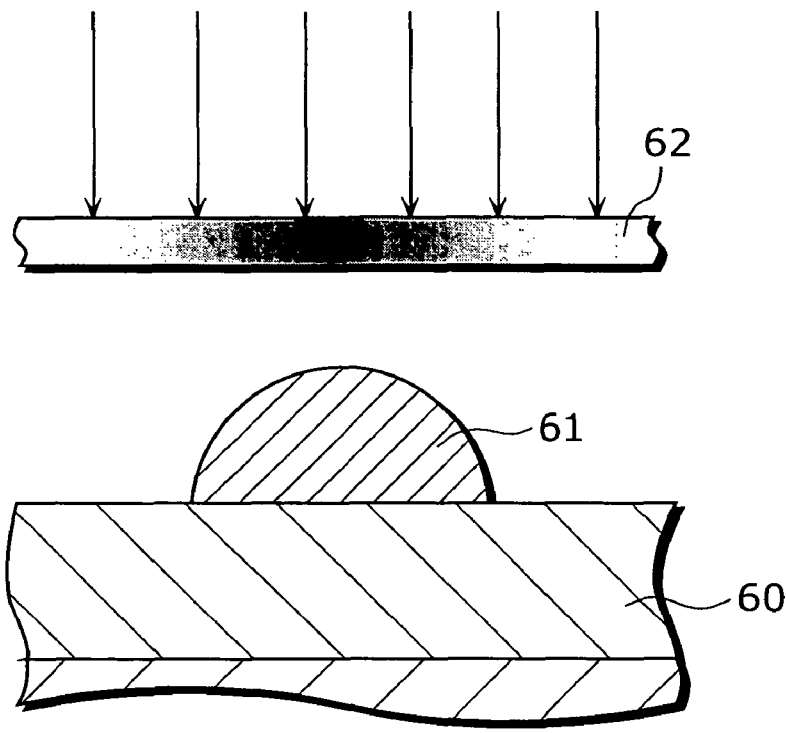
FIG. 9A is a diagram showing a forming method of a microlens having a line symmetric cross-sectional shape.
Figure 9B:
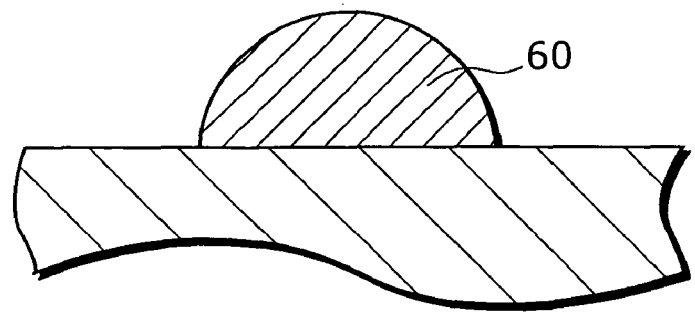
FIG. 9B is a diagram showing a forming method of a microlens having a line symmetric cross-sectional shape.

FIGS. 9A and 9B each is a diagram showing a forming method of a microlens, in the center part, which has a line symmetric cross-sectional shape.

First, as shown in FIG. 9A, a positive type resist 61 is formed on a lens material 60 that is made of an inorganic or organic transparent material. After that, the positive type resist 61 is exposed using a gray scale mask 62 and developed so as to form a hemisphere-shaped positive type resist 61 that has a line symmetric cross-sectional shape.

Next, as shown in FIG. 9B, a hemisphere of the positive type resist 61 is transferred to a lens material 60 using etch back. In this way, a hemisphere-shaped microlens that has a line symmetric cross-sectional shape is formed.

Figure 9C:
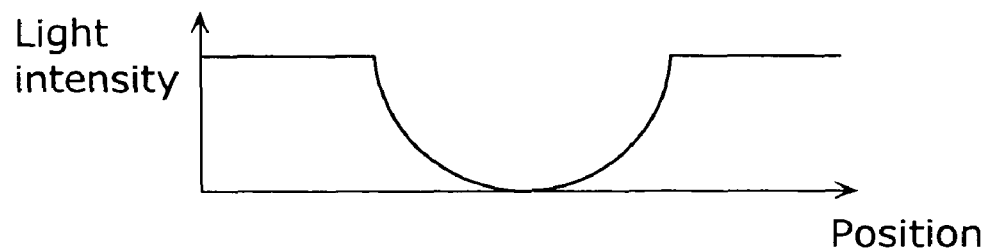
FIG. 9C is a diagram showing the sensitivity of light that has passed through a gray scale mask.

Here, unit patterns are two-dimensionally formed in a gray scale mask 62, and each of these unit patterns in the center part has a line symmetric transmittance distribution. Therefore, the intensity of light that passes through these unit patterns in the center part of the gray scale mask 62 is as shown in FIG. 9C.

Figure 10A:
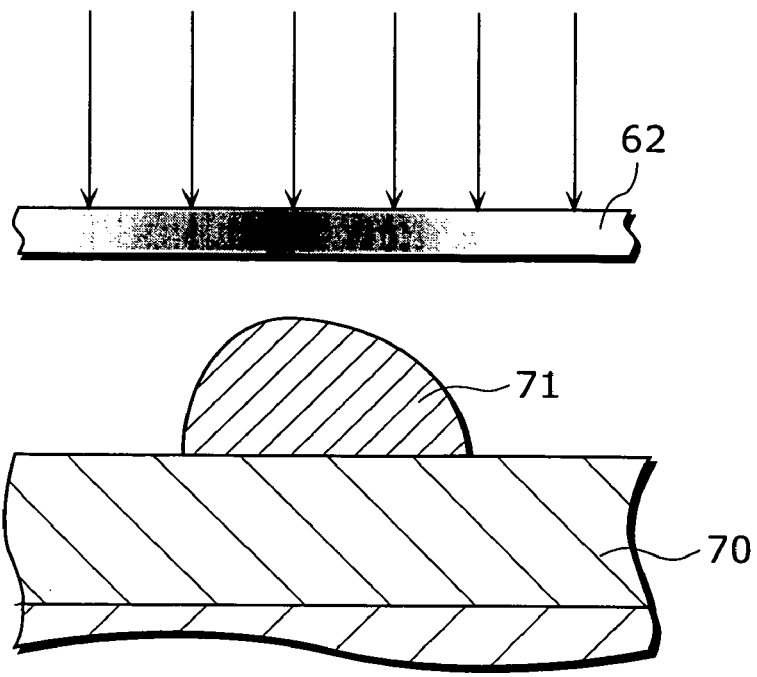
FIG. 10A is a diagram showing a forming method of a microlens having a line asymmetric cross-sectional shape.
Figure 10B:
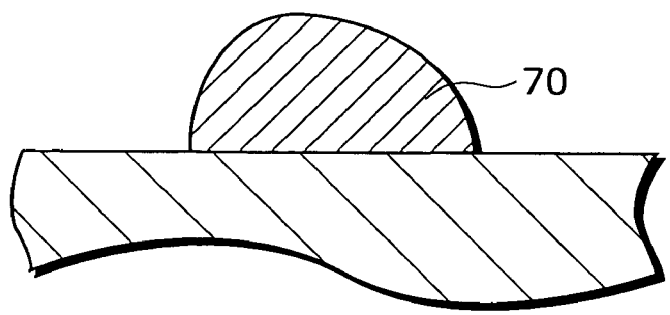
FIG. 10B is a diagram showing a forming method of a microlens having a line asymmetric cross-sectional shape.

FIGS. 10A and 10B each is a diagram showing a forming method of a microlens, in the peripheral part, which has a line asymmetric cross-sectional shape.

First, as shown in FIG. 10A, a positive type resist 71 is formed on a lens material 70 that is made of an inorganic or organic transparent material. After that, the positive type resist 71 is exposed using the gray scale mask 62 and developed so as to form a hemisphere-shaped positive type resist 71 that has a line asymmetric cross-sectional shape.

Next, as shown in FIG. 10B, a hemisphere of the positive type resist.71 is transferred to a lens material 70 using etch back. In this way, a hemisphere-shaped microlens that has a line asymmetric cross-sectional shape is formed.

Figure 10C:
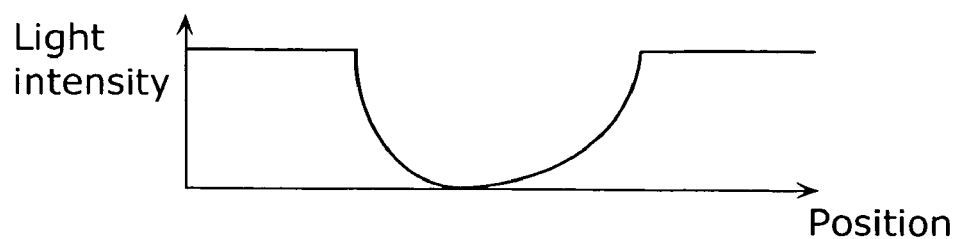
FIG. 10C is a diagram showing the sensitivity of light that has passed through a gray scale mask.

Here, each of these unit patterns in the peripheral part of the gray scale mask 62 has a line asymmetric transmittance distribution. Therefore, the intensity of light that passes through the unit patterns in the peripheral part of the gray scale mask 62 is as shown in FIG. 10C. At this time, in each unit pattern, a point where the color is deepest or a point where the color is lightest are observed, the deepest color point being the point where the transparency is lowest and the lightest color point being the point where the transparency is highest. Displacement of one of the deepest color points and the lightest color points from the respective axes become greater to the periphery of the gray scale mask 62.

As described up to this point, the CCD type solid-state imaging device of this embodiment can prevent deterioration in light condensing efficiency to the photoelectric conversion elements in the peripheral part by guiding an incident light to the photoelectric conversion elements, the light being oblique to the light incidence surfaces of the photoelectric conversion elements and coming into the peripheral part of the image capturing unit. Thus the CCD type solid-state imaging device of the embodiment can have an improved sensitivity.

Also, the CCD solid-state imaging device of this embodiment can prevent deterioration in light condensing efficiency to the photoelectric conversion elements in the peripheral part by controlling the curvatures of the microlenses. Therefore, the CCD solid-state imaging device of this embodiment can be slimed down and have an improved picture quality without having any restriction on the distance between adjacent microlenses unlike the case of the CCD type solid-state imaging device disclosed in Japanese Laid-Open Patent Application No. 10-229180 publication. Thus, the CCD solid-state imaging device can be slimed down and have an improved picture quality without sacrificing its sensitivity.

Up to this point, the CCD type solid-state imaging device concerning the present invention has already been described based on an embodiment. However, the present invention is not limited to this embodiment, in other words, variations and modifications can be realized without deviating from the scope of the present invention.

Figure 11:
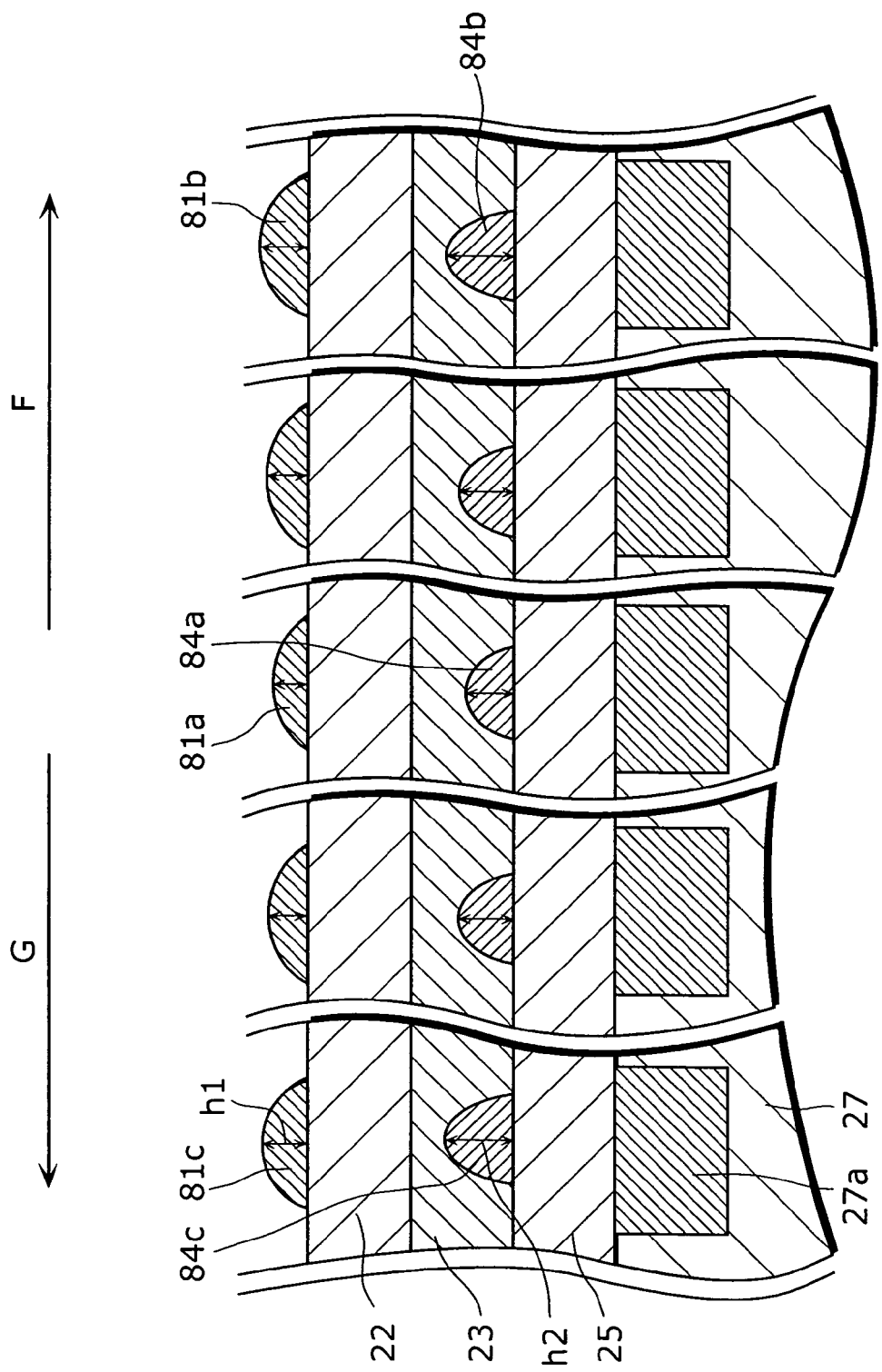
FIG. 11 is a cross-sectional view of the outline of the CCD solid-state imaging device, and the view is for showing a variation of the changes in the shapes of microlenses.

For example, in the case of a CCD type solid-state imaging device in this embodiment, a microlens that has a line symmetric cross-sectional shape is formed in the center part of the image capturing unit and a microlens that has a line asymmetric cross-sectional shape is formed in the peripheral part of the image capturing unit. However, microlenses having a different shape may be formed as long as the maximum curvatures of the convex surfaces of the respective microlenses in the image capturing unit become greater from the center part to the periphery. As shown in FIG. 11, microlenses having a same base shape and a line symmetric cross-sectional shape but having a different height h1 or h2 may be formed in the center part and the peripheral part of the image capturing unit. More specifically, the shapes of the microlenses may change so that the heights h1 of the first microlenses 81a to 81b may become greater from the center part to the right peripheral part of the image capturing unit (to F direction in FIG. 11), and the heights h1 of the first microlenses 81a to 81c may become greater from the center part to the left peripheral part of the image capturing unit (to G direction in FIG. 11). Also, the shapes of the microlenses may change so that the heights h2 of the second microlenses 84a to 84b may become greater from the center part to the right peripheral part of the image capturing unit, and the heights h2 of the second microlenses 84a to 84c may become greater from the center part to the left peripheral part of the image capturing unit.

Also, in the CCD type solid-state imaging device of each of the above embodiments, each hemispherical microlens which has a line symmetric cross-sectional shape or has a line asymmetric cross-sectional shape is formed by forming a hemispherical resist which has a line symmetric cross-sectional shape or has a line asymmetric cross-sectional shape onto each lens material and then transferring the hemispherical shape of the resist to each lens material by means of etch back. However, instead of the means of the above-described transfer, such a hemispherical microlens which has a symmetric cross-sectional shape or an asymmetric cross-sectional shape may be formed by means of subjecting a transparent photosensitive resin such as an acrylic resin that constitutes each microlens to exposure and development using a gray scale mask.

Also, the CCD type solid-state imaging device of each of the above embodiments has a two-layer lens structure which is formed by laminating microlens layers. Each of the microlens layers contains microlenses having a convex part, and the maximum curvatures of the convexes become greater from the center part to the periphery of the image capturing unit. However, such a CCD type solid-state imaging device may have a microlens layer, as one of the laminated microlens layers, which contains microlenses having a convex part, and the maximum curvatures of the convexes become greater from the center part to the periphery of the image capturing unit.

Also, the CCD type solid-state imaging device of the above embodiment has a two-layer lens structure, and a first microlens and a second microlens are formed above each photodiode. However, such a CCD type solid-state imaging device may have a multi-layer lens structure which is formed by laminating two or more microlens layers, each of the layers has microlenses having a convex part, and the maximum curvatures of the convexes become greater from the center part to the periphery of the image capturing unit. In this way the light condensing efficiency of the CCD type solid-state imaging device can be improved. Therefore, the CCD type solid-state imaging device can have a further improved sensitivity. Also, the CCD type solid-state imaging device may have a single-layer lens structure that is composed of a single microlens layer, each microlens in the layer has a convex part, and the maximum curvatures of the convexes become greater from the center part to the periphery of the image capturing unit.

Also, in the above embodiment, a CCD type solid-state imaging device has been described as an example of a solid-state imaging device including microlenses having a convex part, and the maximum curvatures of the convexes become greater from the center part to the periphery of the image capturing unit. However, such a solid-state imaging device may be a MOS type solid-state imaging device.

Second Embodiment

A camera that mounts a solid-state imaging device in this embodiment of the present invention will be described below with reference to figures.

Figure 12:
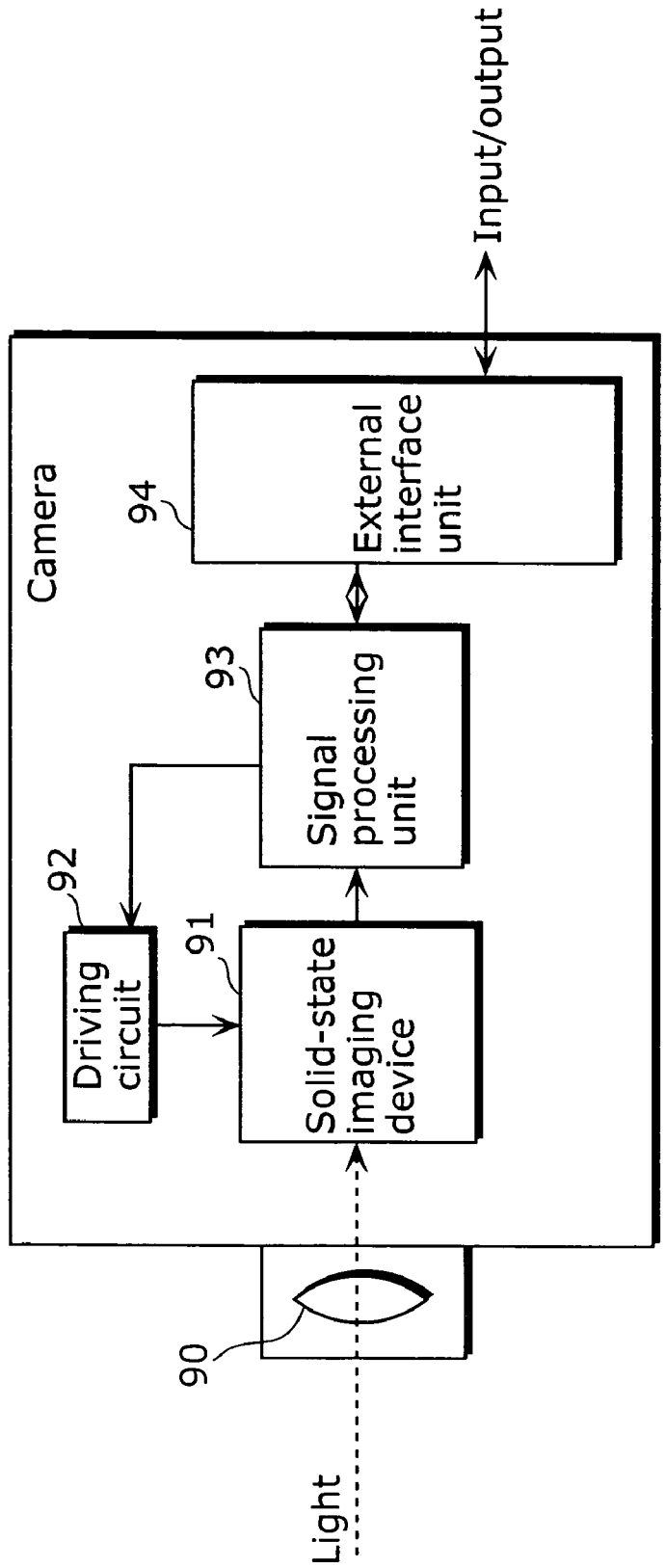
FIG. 12 is a block diagram of a camera of a second embodiment of the present invention.

FIG. 12 is a block diagram of a camera in the second embodiment.

As shown in FIG. 12, the camera includes: a lens 90; a solid-state imaging device 91; a driving circuit 92; a signal processing unit 93 and an external interface unit 94.

In the camera having the above-described structure, the processing until a signal is outputted to outside will be performed in the following order.

(1) Light passes through the lens 90 and enters the solid-state imaging device 91.

(2) The signal processing unit 93 drives the solid-state imaging device 91 using the driving circuit 92 and intakes the output signal from the solid-state imaging device 91.

(3) The signal processed by the signal processing unit 93 is outputted to outside through the external interface unit 94.

As described above, with the camera of this embodiment, data can be outputted by a slimed-down solid-state imaging device having an improved sensitivity and also an improved picture quality. Therefore, the camera of this embodiment can be a small camera having an excellent picture quality.

INDUSTRIAL APPLICABILITY

The present invention can be used for a solid-state imaging device and especially for microlenses and the like that can be arranged above photoelectric conversion elements respectively.

The disclosure of Japanese Patent Application No. 2004-231318 filed on Aug. 6, 2004 including specification, drawings and claims is incorporated herein by reference in its entirety.

What is claimed is:

1. A solid-state imaging device comprising:
an image capturing unit having unit cells arranged in a two-dimensional array, each unit cell including a photoelectric conversion element and an upward convex microlens disposed above the photoelectric conversion element, at least one unit cell being positioned in a peripheral part of the image capturing unit,
wherein a summit of the upward convex microlens in the at least one unit cell positioned in the peripheral part of the image capturing unit is displaced from a center thereof to a point closer to a center part of the image capturing unit,
wherein at least one unit cell is positioned in the center part of the image capturing unit, and the upward convex microlens in the at least one unit cell in the center part of the image capturing unit has a cross-sectional shape that is line symmetric with respect to a line which (i) is perpendicular to a light incidence surface of the photoelectric conversion element and (ii) passes through a summit thereof, and
the upward convex microlens which is in the at least one unit cell in the peripheral part of the image capturing unit has a cross-sectional shape that is line asymmetric with respect to the line which (i) is perpendicular to the light incidence surface of the photoelectric conversion element and (ii) passes through the summit thereof.

2. The solid-state imaging device according to claim 1, wherein each upward convex microlens has a summit, and displacement levels of the summits of the upward convex microlenses of the unit cells increase from the center part to the peripheral part of the image capturing unit.

3. The solid-state imaging device according to claim 1, wherein a maximum curvature of the upward convex microlens in the at least one unit cell positioned in the peripheral part of the image capturing unit is greater than a maximum curvature of the upward convex microlens in the at least one unit cell positioned in the center part of the image capturing unit.

4. The solid-state imaging device according to claim 3, wherein the maximum curvatures of the upward convex microlenses of the unit cells increase from the center part to the peripheral part of the image capturing unit.

5. The solid-state imaging device according to claim 1, wherein a bottom surface of each upward convex microlens is flat.

6. A solid-state imaging device comprising:
an image capturing unit having unit cells arranged in a two-dimensional array, each unit cell including a photoelectric conversion element and an upward convex microlens disposed above the photoelectric conversion element, at least one unit cell being positioned in a peripheral part of the image capturing unit,
wherein a summit of the upward convex microlens in the at least one unit cell positioned in the peripheral part of the image capturing unit is displaced from a center thereof to a point closer to a center part of the image capturing unit,
wherein each unit cell includes an inter-layer lens disposed between the upward convex microlens and the photoelectric conversion element, and
wherein a summit of the inter-layer lens in the at least one unit cell in the peripheral part of the image capturing unit is displaced from a center of the inter-layer lens to a point closer to the center part of the image capturing unit.

7. The solid-state Imaging device according to claim 6, wherein at least one unit cell is positioned in the center part of the image capturing unit, and a maximum curvature of the inter-layer lens in the at least one unit cell in the peripheral part of the image capturing unit is greater than a maximum curvature of the inter-layer lens in the at least one unit cell in the center part of the image capturing unit.

8. The solid-state imaging device according to claim 6, wherein a bottom surface of the inter-layer lens is flat.

9. The solid-state imaging device according to claim 6, wherein each upward convex microlens has a summit, and displacement levels of the summits of the upward convex microlenses of the unit cells increase from the center part to the peripheral part of the image capturing unit.

10. The solid-state imaging device according to claim 7, wherein the maximum curvatures of the upward convex microlenses of the unit cells increase from the center part to the peripheral part of the image capturing unit.

* * * * *